(12) United States Patent
Naujokat et al.

(10) Patent No.: US 7,400,130 B2
(45) Date of Patent: Jul. 15, 2008

(54) INTEGRATED CIRCUIT DEVICE

(75) Inventors: Joern Naujokat, Freising (DE); Ralf Sonnhueter, Schrobenhausen (DE); Markus Dietl, Munich (DE)

(73) Assignee: Texas Instruments Deutschland GmbH, Freising (DE)

( * ) Notice: Subject to any disclaimer, the term of this patent is extended or adjusted under 35 U.S.C. 154(b) by 135 days.

(21) Appl. No.: 11/468,699

(22) Filed: Aug. 30, 2006

(65) Prior Publication Data

US 2007/0052487 A1 Mar. 8, 2007

(51) Int. Cl.
G06M 1/10 (2006.01)
G01R 23/12 (2006.01)
G01R 31/28 (2006.01)

(52) U.S. Cl. ............. 324/76.62; 324/76.53; 324/76.48; 324/158.1

(58) Field of Classification Search ............. 324/76.62, 324/76.48, 76.53, 158.1
See application file for complete search history.

(56) References Cited

U.S. PATENT DOCUMENTS

| 4,374,358 | A | * | 2/1983 | Hirose | ................ | 324/76.58 |
|---|---|---|---|---|---|---|
| 5,381,085 | A | | 1/1995 | Fischer | | |
| 6,396,889 | B1 | | 5/2002 | Sunter et al. | | |
| 6,557,117 | B1 | | 4/2003 | Wu et al. | | |
| 6,622,106 | B2 | * | 9/2003 | Rocchi et al. | ................ | 702/107 |
| 2004/0053595 | A1 | * | 3/2004 | Shinbo et al. | ................ | 455/316 |

* cited by examiner

*Primary Examiner*—Andrew H Hirshfeld
*Assistant Examiner*—Amy He
(74) *Attorney, Agent, or Firm*—Wade J. Brady, III; Frederick J. Telecky, Jr.

(57) ABSTRACT

An integrated circuit device comprises internally on-chip an oscillator with a signal output. The device has a reference clock input, a first counter with a count input, a control input and a counter output, a second counter with a count input, a control input and an overflow indication output, and a test control logic circuit. The count input of the first counter is connected to the signal output of the oscillator. The count input of the second counter is connected to the reference clock input. The overflow indication output of the second counter is connected to an input of the test control logic circuit. The test control circuit has an output connected to the control input of the first counter to apply a stop counting control signal to the first counter after it has received an overflow indication signal from the second counter. The first counter after it has received a stop counting control signal provides a count at the counter output which is indicative of the output frequency of the oscillator. The device includes all the hardware necessary to perform an on-chip test of the oscillator, thereby obviating the need for serial testing on sophisticated and expensive test equipment.

7 Claims, 1 Drawing Sheet

INTEGRATED CIRCUIT DEVICE

The present invention relates to an integrated circuit device that has an oscillator such as a voltage controlled oscillator in a PLL internally on-chip.

BACKGROUND

For series production of these integrated circuit (IC) devices, the proper function of the oscillator is of paramount importance. This is why testing of the device for proper function of the oscillator is a requirement. For such testing, automatic test equipment (ATE) is available. Of course, one criterion of proper oscillator operation is the frequency of its output signal. The tests are done in series (one device each time) given the expensive high precision test equipment. For high oscillator output frequencies (e.g. 800 MHz), additional test board hardware with divider circuits is needed, thus increasing the overall cost for testing.

SUMMARY

The present invention provides an integrated circuit device comprising an oscillator internally on-chip and permitting to test the proper function of the oscillator without resorting to expensive test equipment, thereby also opening a way for parallel testing in the production chain.

Specifically, the invention provides an integrated circuit device that comprises internally on-chip an oscillator with a signal output. The device has a reference clock input, a first counter with a count input, a control input and a counter output, a second counter with a count input, a control input and an overflow indication output, and a test control logic circuit. The count input of the first counter is connected to the signal output of the oscillator. The count input of the second counter is connected to the reference clock input. The overflow indication output of the second counter is connected to an input of the test control logic circuit. The test control circuit has an output connected to the control input of the first counter to apply a stop counting control signal to the first counter after it has received an overflow indication signal from the second counter. The first counter after it has received a stop counting control signal provides a count at the counter output which is indicative of the output frequency of the oscillator. Accordingly, the device includes all the hardware necessary to perform an on-chip test of the oscillator. The two counters and the test control logic circuit need some additional chip area, but the required additional area is small compared to the chip area of an entire PLL circuit. What matters here is the possibility of using simple and low cost ATE, and the ensuing parallel testing in production of the devices, in contrast to serial testing on sophisticated and expensive ATE.

In a typical embodiment, the device includes an on-chip phase locked loop (PLL), and the oscillator is the voltage controlled oscillator of the PLL. The reference input of the PLL is connected to the reference clock input of the device.

In a specific embodiment, the test control logic circuit controls a first switch that selectively connects the count input of the first counter with the signal output of the oscillator and a second switch that selectively connects the count input of the second counter with the reference clock input. Preferably, the test control logic circuit controls the second switch to close in synchronism with an edge of a reference clock signal applied to the reference clock input, which edge initiates a period of the reference clock signal.

In embodiments where the device includes a data bus and a bus interface, the count of the first counter, after the counting stop signal is received, is applied to the data bus as a digital data word externally available through the bus interface.

In embodiments where the device includes a serial bus interface, the test control logic circuit has control inputs that include at least a start control input and a reset control input, and the control inputs of the test control logic circuit are derived from the serial bus interface.

BRIEF DESCRIPTION OF THE DRAWINGS

Further details of the invention will appear from the following description of preferred embodiments with reference to the appending drawings. In the drawings:

With reference to FIG. 1, some circuitry of an integrated circuit device is illustrated. The device includes an internal PLL circuit 10 with a reference clock input connected to a reference clock input stage 12 that receives a clock input signal CLK_IN. The PLL circuit 10 has an output connected to an output stage 14 that supplies PLL clock output signal CLK OUT at its output. The input to and the output from PLL circuit 10 are also applied to an embedded test circuit 16. Test circuit 16 has control inputs from a serial bus interface 18 to which a serial bus SER BUS of the device is connected. Test circuit 16 has an output connected to a bus data register 20, in turn connected to a bus controller 22 that supplies a data word DATA on its output.

Figure 1:
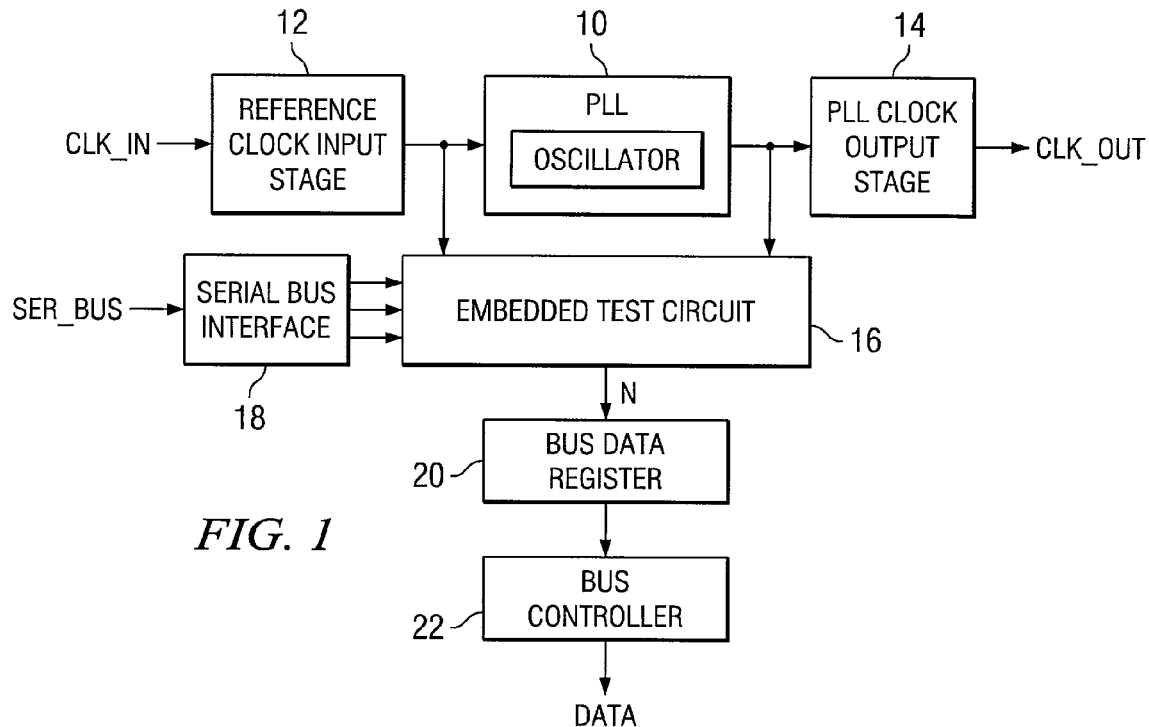
FIG. 1 is a block diagram schematically illustrating certain functional parts of an integrated circuit device including a PLL and a testing block for the oscillator included in the PLL.

Although the CLK 1N input is shown in FIG. 1 as separate from the CLK OUT output, both are actually fed through the common parallel bus interface.

Figure 2:
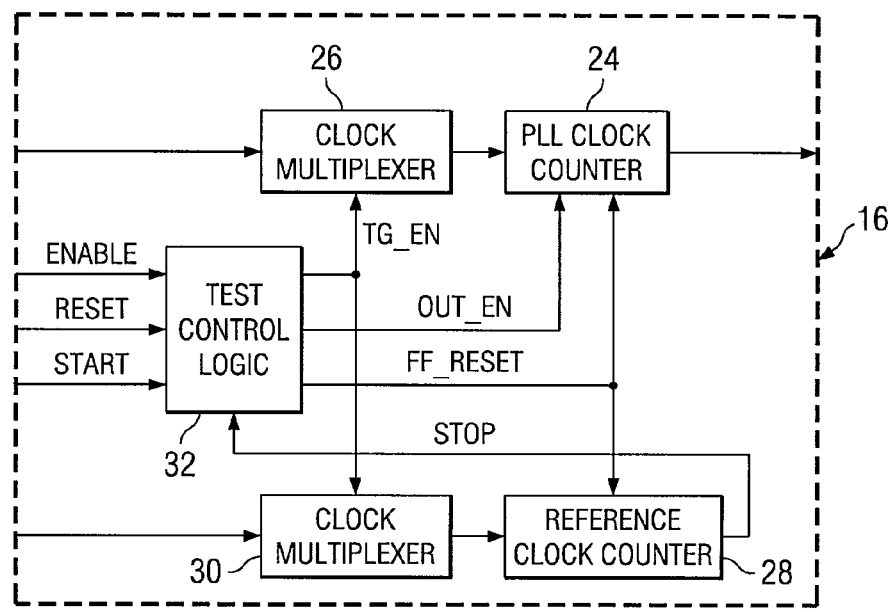
FIG. 2 is a block diagram schematically illustrating details of the testing block in FIG. 1.

FIG. 2 shows the details of the embedded test circuit 16.

DETAILED DESCRIPTION OF EMBODIMENTS

The output of PLL circuit 10 is a signal CLK PLL applied to a PLL clock counter 24 through a multiplexer 26. The reference clock signal CLK_REF is applied to a reference clock counter 28 through a multiplexer 30. Multiplexers 26, 30 act as switches to selectively block or pass the clock signals CLK_PLL and CLK REF to counters 24 and 28 in response to a control signal TG_EN received from a test control logic circuit 32. Inputs to the test control logic circuit 32 are control signals ENABLE, START and RESET from serial bus interface 18. A reset control output from circuit 32 is connected to both counters 24, 28 to supply a reset control signal FF_RESET in preparation for a counting cycle.

Reference clock counter 28 has a fixed capacity M of e.g. 1024. An output of counter 28 is connected to test control logic circuit 32 to provide an overflow indication signal STOP. In response to receiving the signal STOP, circuit 32 disables multiplexers 26, 30 to block the clock signal transmission to counters 24, 28.

The test control logic circuit 32 is controlled by the three external signals ENABLE, RESET and START. At the beginning of the test procedure, the ENABLE signal is set to high in order to enable the circuit 32. Then, a high pulse of the RESET signal resets all flip-flops in both counters 24, 28 and in the test control logic circuit 32. After that, the START signal is set to high in order to start the counting of clock counters 24, 28. This is done by setting the internal TG_EN signal to high. This high TG_EN signal will make both clock multiplexers 26, 30 transparent so that the incoming clock signals are switched to the inputs of both counters. Then, both clock counters 24, 28 are counting the incoming clock periods. If the reference clock counter 28 reaches its final counter value M, then the internal STOP signal goes high and disconnects the incoming clocks from the inputs of the counters. This will stop the counting process. The PLL clock counter 24 consists of counter flip-flops and of a transfer gate bank. The transfer gates are controlled by an internal control signal OUT_EN. During counting, the control signal OUT_EN is low and the gates are blocked. After a certain waiting time (e.g. two or more reference clock cycles) to allow both counters to stabilize so that all counter registers are settled, control signal OUT_EN goes high and the transfer gates of the PLL clock counter 24 are set transparent. Then, the count N of PLL clock counter 24 is read out and provided as a digital data word DATA to the bus to which the device is connected by bus controller 22.

Knowing the defined reference counter value M and the reference clock period Trefclk and getting the counter value N of the PLL clock counter 24 which has counted the clock to be measured and neglecting some uncertainties which will be discussed below, the following calculation can be done:

M is the defined reference clock counter value.

N is the PLL clock counter value which is read out as a digital output word after the test cycle.

Tmeasure is the measurement time (the time in which the counters are running).

Trefclk is the period of the defined reference input clock.

Tpllclk is the period of the PLL output clock.

Frefcik is the frequency of the defined reference input clock. Fpllclk is the frequency of the PLL output clock.

$$T_{measure} = T_{refclk} * M$$
$$= T_{pllclk} * N$$
$$\rightarrow T_{pllclk} - T_{reffclk} * (M/N)$$
$$\Rightarrow F_{pllclk}$$
$$= F_{refclk} * (N/M)$$

With the equation above, the frequency of the PLL can easily be calculated. As mentioned before, this calculation is done by neglecting some uncertainties.

The first uncertainty comes from the fact that the START signal which defines the start of the clock counting is asynchronous to both input clocks, especially to the reference clock. The best case is that the START/TG EN signal comes synchronous to the rising edge of the reference period. Then, the measurement time/counting time of the PLL counter 24 is exactly Trefclk*M. The worst case is that the START/TG_EN signal comes directly after a rising edge of a reference clock period. Then, the measurement time/counting time of the PLL counter 24 is nearly Trefclk*(M+1). Depending on this measurement time uncertainty, the final PLL counter value is between the expected counter value of N [best case] and a possible counter value of (N+(Tpllclk/refclk)) [ worst case].

The second uncertainty comes from the fact that after the reference counter has reached the final counter value M it takes a certain propagation delay time for the STOP signal to go through the logic block and then to set the clock multiplexers 26, 30 into the disconnect mode and therefore to stop the counting process.

The ratio of the propagation delay time Tprop and the PLL output clock period Tpllclk gives the number of additional counts the counter will do:

Tpllclk/Tprop.

These two uncertainties will lead to the following equation:

$$=> T_{refclk}*(M/(N-|(T_{pllclk}/T_{prop})))<T_{pllclk}<T_{refclk}*(M/(N+(T_{pllclk}/T_{prop})+(T_{pllclk}/T_{refclk})))$$

The frequency measurement accuracy depends on the frequency ratio between the reference clock and the expected PLL output clock, on the propagation delay time of the STOP signal and on the reference counter value M which determines the measurement time.

The higher the reference counter value M is, the higher the PLL counter value N will be too. The higher N is, the more the other terms (mainly the uncertainty factor) can be neglected and the more accurate the frequency measurement will be.

The first uncertainty regarding the time between the START signal and the rising edge of the reference clock is avoided by synchronizing the clock multiplexer switch timing with the timing of the rising reference clock edge.

The second uncertainty can be neglected if a sufficiently high counting capacity M is chosen for counter 28.

In the embodiment disclosed so far, the ENABLE, START and RESET control signals are received from through the serial bus interface 18. In an alternative embodiment the integrated circuit has dedicated pins at least for the START and STOP control signals, allowing faster test cycles than would be possible with control signals applied through the serial bus.

The invention claimed is:

1. An integrated circuit device comprising internally on-chip:
    an oscillator with a signal output,
    a reference clock input,
    a first counter with a count input, a control input and a counter output,
    a second counter with a count input, a control input and an overflow indication output,
    and a test control logic circuit;
  wherein
    the count input of the first counter is connected to the signal output of the oscillator,
    the count input of the second counter is connected to the reference clock input,
    the overflow indication output of the second counter is connected to an input of the test control logic circuit,
    the test control circuit has an output connected to the control input of the first counter to apply a stop counting control signal to the first counter after it has received an overflow indication signal from the second counter;
    and the first counter after it has received a stop counting control signal provides a count at the counter output which is indicative of the output frequency of the oscillator.

2. The integrated circuit of claim 1, and further comprising an on-chip phase locked loop including said oscillator and having a reference input connected to said reference clock input.

3. The integrated circuit of claim 1, wherein the test control logic circuit controls a first switch that selectively connects the count input of the first
    counter with the signal output of the oscillator and a second switch that selectively connects the count input of the second counter with the reference clock input.

4. The integrated circuit of claim 1, wherein the test control logic circuit controls the second switch to close in synchronism with an edge of a reference clock signal applied to the reference clock input, said edge initiating a period of the reference clock signal.

5. The integrated circuit according to claim 1, and further comprising a data bus and a bus interface, the count of the first counter after the counting stop signal is received being applied to the data bus as a digital data word externally available through the bus interface.

6. The integrated circuit according to claim 1, further comprising a serial bus interface, the test control logic circuit having control inputs that include at least a start control input and a reset control input, and the control inputs of the test control logic circuit being derived from the serial bus interface.

7. The integrated circuit according to claim 1, wherein the test control logic circuit has control inputs that include a start control input and a reset control input, each of the start and reset control inputs being connected to a dedicated pin of the integrated circuit.

* * * * *